US006965197B2

(12) United States Patent
Tyan et al.

(10) Patent No.: US 6,965,197 B2
(45) Date of Patent: Nov. 15, 2005

(54) ORGANIC LIGHT-EMITTING DEVICE HAVING ENHANCED LIGHT EXTRACTION EFFICIENCY

(75) Inventors: Yuan-Sheng Tyan, Webster, NY (US); Ching W. Tang, Rochester, NY (US); Liang-Sheng Liao, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 310 days.

(21) Appl. No.: 10/261,520

(22) Filed: Oct. 1, 2002

(65) Prior Publication Data

US 2004/0061136 A1 Apr. 1, 2004

(51) Int. Cl.[7] .............................. H01J 1/62; H01J 63/04
(52) U.S. Cl. ....................... 313/506; 313/504; 313/509; 313/512
(58) Field of Search ................................ 313/504, 506, 313/511, 512

(56) References Cited

U.S. PATENT DOCUMENTS

| | | | | |
|---|---|---|---|---|
| 4,769,292 A | | 9/1988 | Tang et al. | 428/690 |
| 5,936,347 A | * | 8/1999 | Isaka et al. | 313/509 |
| 5,955,837 A | * | 9/1999 | Horikx et al. | 313/506 |
| 6,476,550 B1 | * | 11/2002 | Oda et al. | 313/504 |
| 6,538,375 B1 | * | 3/2003 | Duggal et al. | 313/506 |
| 6,787,990 B2 | * | 9/2004 | Cok | 313/504 |
| 2001/0026124 A1 | | 10/2001 | Liu et al. | |

FOREIGN PATENT DOCUMENTS

| | | |
|---|---|---|
| WO | 99/39393 | 2/1998 |
| WO | 02/37568 A1 | 5/2002 |
| WO | 02/37580 A1 | 5/2002 |
| WO | WO 02/37580 | 5/2002 |

OTHER PUBLICATIONS

"Extraordinary transmission of organic photoluminescence through an otherwise opaque metal layer via surface plasmon cross coupling" by Dawn Gifford, Applied Physics Letters, vol. 80, No. 20, May 20, 2002, pp. 3679–3681.
"Bragg scattering from periodically microstructured light emitting diodes" by John Lupton et al., Applied Physics Letters, vol. 77, No. 21, Nov. 20, 2000, pp. 3340–3342.
"Improvement of output coupling efficiency of organic light emitting diodes by backside substrate modification" by C.F. Madigan, et al., Applied Physics Letters, vol. 76, No. 13, Mar. 27, 2000, pp. 1650–1652.
"High–external–quantum–efficiency organic light–emitting devices", by G. Gu, et al., Optics Letters, vol. 22, No. 6, Mar. 15, 1997, pp. 396–398.
"Increased efficiency and controlled light output from a microstructured light–emitting diode", by Benjamin J. Matterson, et al., Advanced Materials 2001, 13, No. 2, Jan. 16, pp. 123–127.
"Sputter deposition of cathodes in organic light emitting diodes" by L. S. Hung, Journal of Applied Physics, vol. 86, No. 8, Oct. 15, 1999, pp. 4607–4612.

* cited by examiner

Primary Examiner—Nimeshkumar D. Patel
Assistant Examiner—Matt Hodges
(74) Attorney, Agent, or Firm—Raymond L. Owens (57) ABSTRACT

An enhanced light extraction OLED device including a transparent substrate; light scattering layer disposed over a first surface of the transparent substrate; a transparent first electrode layer disposed over the light scattering layer; an organic EL element disposed over the transparent first electrode layer and including one or more organic layers but at least one light emitting layer in which light is produced; and a transparent second electrode layer disposed over the organic EL element.

45 Claims, 5 Drawing Sheets

ORGANIC LIGHT-EMITTING DEVICE HAVING ENHANCED LIGHT EXTRACTION EFFICIENCY

FIELD OF THE INVENTION

This invention relates to organic light-emitting diodes (OLEDs) having enhanced light extraction efficiency and are useful as light sources and displays.

BACKGROUND OF THE INVENTION

Organic light emitting devices (OLED) generally can have two formats known as small molecule devices such as disclosed in commonly-assigned U.S. Pat. No. 4,476,292 and polymer OLED devices such as disclosed in U.S. Pat. No. 5,247,190. Either type of OLED device may include, in sequence, an anode, an organic EL element, and a cathode. The organic EL element disposed between the anode and the cathode commonly includes an organic hole-transporting layer (HTL), an emissive layer (EL) and an organic electron-transporting layer (ETL). Holes and electrons recombine and emit light in the EL layer. Tang et al. (Appl. Phys. Lett., 51, 913 (1987), Journal of Applied Physics, 65, 3610 (1989), and commonly assigned U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EL can determine how efficiently the electrons and holes be recombined and result in the emission of light, etc. It has been found, however, that one of the key factors that limits the efficiency of OLED devices is the inefficiency in extracting the photons generated by the electron-hole recombination out of the OLED devices. Due to the high optical indices of the organic materials used, most of the photons generated by the recombination process are actually trapped in the devices due to total internal reflection. These trapped photons never leave the OLED devices and make no contribution to the light output from these devices.

A typical OLED device uses a glass substrate, a transparent conducting anode such as indium-tin-oxide (ITO), a stack of organic layers, and a reflective anode layer. Light generated from the device is emitted through the glass substrate. This is commonly referred to as the bottom-emitting device. Alternatively, a device can include a substrate, a reflective anode, a stack of organic layers, and a top transparent electrode layer. Light generated from the device is emitted through the top transparent electrode. This is commonly referred to as the top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light can actually emit from the device and perform useful functions.

Madigan et al (Appl. Phys. Lett, Vol 76, No. 13, p 1650, 2000) taught the use of high index substrates with microlens to enhance the light extraction efficiency. Matterson et al (Adv. Mater. 2001, 13, No.2, p123–127), Lupton et al (Appl. Phys. Lett. Vol 77, No. 21, p3340, 2000) taught the use of corrugated substrates to improve light extraction. Garbuzov et al (Optics Letters, Vol. 22, No. 6, p. 396, 1997) taught the use of substrates with special shaped microstructures to improve light extraction. Gifford et al (Appl. Phys. Lett. Vol. 80, No. 20, p. 3679, 2002) taught the use of substrates with periodical structure and opaque metal layer to enhance light coupling through surface plasmon cross coupling. All these methods, however, suffer the common problem of much increased complexity in the device construction and at the same time produce light outputs that have high angular and wavelength dependence which are not suitable for many practical applications.

Chou (International Publication Number WO 02/37580 A1) and Liu et al. (US 2001/0026124 A1) taught the use of a volume or surface scattering layer to improve light extraction. The scattering layer is applied next to the organic layers or on the outside surface of the glass substrate and has optical index that matches these layers. Light emitted from the OLED device at higher than critical angle that would have otherwise been trapped can penetrate into the scattering layer and be scattered out of the device. The efficiency of the OLED device is thereby improved but still have deficiencies.

SUMMARY OF THE INVENTION

It is an object of the present invention to provide an OLED device with improved light extraction efficiency.

It is a further object of the present invention to provide a top emitting OLED device with improved light extraction efficiency.

It is a further object of the present invention to provide a bottom emitting OLED device with improved light extraction efficiency.

It is another object of the present invention to provide an OLED device on a flexible support with improved light extraction efficiency.

It is another object of the present invention to provide an OLED device that is compatible with active-matrix display structure.

It is another object of the present invention to provide an OLED device that is compatible with passive-matrix display structure.

These objects are achieved in an enhanced light extraction OLED device comprising:
(a) a transparent substrate;
(b) a light scattering layer disposed over a first surface of the transparent substrate;
(c) a transparent first electrode layer disposed over the light scattering layer;
(d) an organic EL element disposed over the transparent first electrode layer and including one or more organic layers but at least one light emitting layer in which light is produced; and
(e) a transparent second electrode layer disposed over the organic EL element.

These objects are also achieved by providing an OLED device having means to scatter light out of the device and having means that minimizes light absorption within the device. Means to scatter light include the use of a light scattering layer strategically located within the device structure. Means to minimize light absorption within the device includes either the use of two essentially transparent electrodes or the use of one transparent electrode and one highly reflective electrode selected from a list including Ag, Ag-based alloys, and Al. When two transparent electrodes are used, the device may include an external reflector or an internal reflector. If an internal reflector is used, a low index isolation layer is preferably used in combination with this reflector layer, especially if the reflector layer is not selected from the list of Ag, Ag-based alloys, and Al.

Devices made in accordance with the present invention are particularly useful as light sources that can replace light bulbs. They are also useful as display devices.

DETAILED DESCRIPTION OF THE INVENTION

Figure 1:
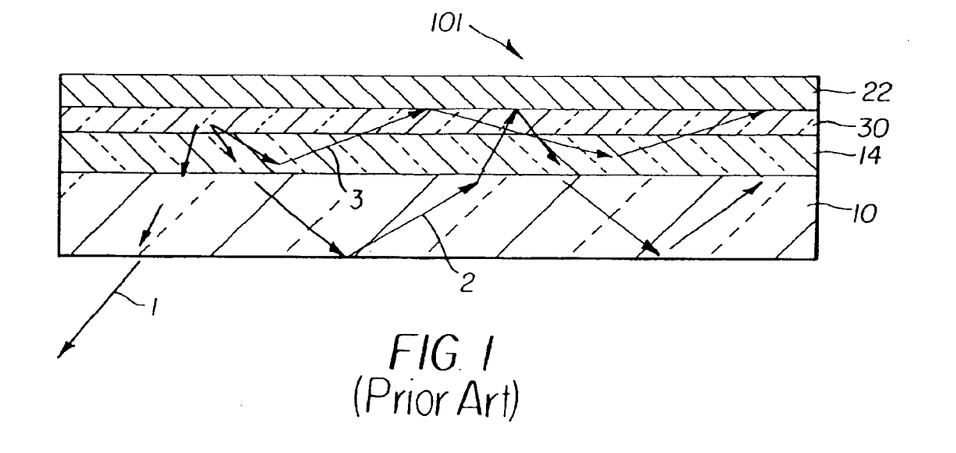
FIG. 1 depicts a schematic cross sectional view of a conventional prior art OLED.

FIG. 1 is a schematic illustration of the cross section of a typical conventional OLED device 101 including a substrate 10, an anode layer 14, an organic EL element 30, and a cathode layer 22. Organic EL element 30 can include one to several sub-layers, including a hole injection layer, a hole transparent layer, a light emitting layer, an electron transport layer, and an electron injection layers. Most commonly, substrate 10 and anode layer 14 are both transparent, cathode layer 22 is reflecting, and light generated from the device is emitted through anode layer 14 and substrate 10. This is commonly referred to as a bottom emitting OLED device. An OLED device can also be top emitting. In a top emitting OLED device, the anode layer is made reflective and the cathode layer is made transparent and the generated light is emitted through the cathode layer. The discussion below based on bottom emitting devices is also applicable to top emitting devices. In addition, the layer sequence discussed above can be reversed: cathode layer 22 can be deposited on the substrate 10 and anode layer 14 can be disposed over organic EL element 30.

Typically, organic EL element 30 and transparent anode layer 14 are made of materials of high optical indexes, substrate 10 is made of lower index material but its index is still substantially higher than that of air. Light generated from organic EL element 30 is emitted in all directions. The portion 1 of light from organic EL element 30 emitted at a small angle from the plane normal, hereto referred to as small angle light 1, can transmit through anode layer 14 and substrate 10 and be useful for outside applications. The portion 2 of light from organic EL element 30 emitted at a somewhat larger angle than portion 1 can transmit through anode layer 14 but will exceed the critical angle at the substrate 10/air interface and be reflected back. Portion 2, hereto referred to as substrate-mode light 2, is therefore trapped in the OLED device 101 and not be available for useful applications. Similarly, portion 3 of light from organic EL element 30 emitted at even larger angles is trapped by internal reflection within organic EL element 30 and anode 14. Portion 3, hereto referred to as to as organic-mode light 3, is also not available for useful applications. Since only small angle light 1 is useful for applications, the light extraction efficiency of OLED device 101 is limited.

Figure 2:
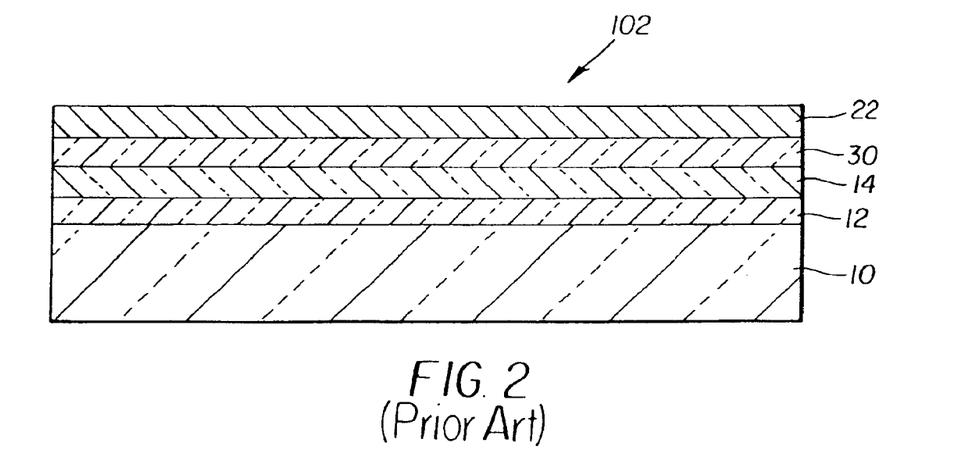
FIG. 2 depicts a schematic cross section view of another OLED device according to the prior art wherein a light scattering layer is used to improve light extraction efficiency.

FIG. 2 is a schematic illustration of the cross section of a prior art OLED device 102 that is designed to improve the light extraction efficiency by inserting a light scattering layer 12 between the transparent substrate 10 and the organic EL element 30. OLED device 102 includes a transparent substrate 10, a light scattering layer 12, a transparent anode layer 14, an organic EL element 30, and a reflecting cathode layer 22. When light passes through light scattering layer 12, a portion of it is scattered in all directions. Thus when substrate-mode light 2 or organic-light 3 passes through light scattering layer 13, a portion can be scattered out of the OLED device 102 and is no longer trapped. The remaining fraction stays trapped and is reflected back and forth between the reflecting cathode 22 and the organic EL element 30/substrate 10 interface or the substrate 10/air interface. Each time it passes through light scattering layer 12, it is partially scattered out of the OLED device 102. The light extraction efficiency is improved.

In practical devices, however, each time light is reflected by the reflecting cathode 22, it is also partially absorbed. This is because the layers commonly used in OLED devices as reflecting cathodes, such as MgAg alloy or CuPc/Al(Li) (J. Appl. Phys. V86, No. 8, P4610, 1999), usually have limited reflectivity and are partially absorbing. Since the trapped substrate-mode light 2 and organic-mode light 3 have to make many passes through light scattering layer 12 before they can be total scattered out of the OLED device 102, they are quickly attenuated by multiple absorption by the reflecting cathode layer 22. In addition, light scattering layer 12 can also cause some of the small angle light 1 to change its direction and become trapped in the OLED device 102. This trapped component of small angle light 1 is also attenuated by the partially absorbing reflecting cathode 22. The net gain in light coupling efficiency can be quite small or even negative if the reflecting cathode 22 is significantly absorbing.

The present invention contemplates improving light coupling efficiency by providing an OLED device having means to scatter light out of the, device and having means to reduce light absorption within the device. By incorporating means to reduce light absorption within an OLED device, the attenuation of trapped light in the device can be reduced and the light coupling efficiency can be improved. Means to scatter light includes the use of a light scattering layer strategically located within the device structure. Means to reduce light absorption within the device includes either the use of two essentially transparent electrodes or the use of one transparent electrode and one highly reflective electrode selected from a list including Ag, Ag-based alloys, and Al. When two transparent electrodes are used, the device may also include a reflector. A reflector layer can be added to the structure of an OLED device to function as an internal reflector. Alternatively, a reflector fixture outside the OLED device can be used. If an internal reflector is used, a low index isolation layer is preferably used in combination with this reflector layer to reduce absorption of trap layer by this internal reflector layer, especially if the reflector layer is not selected from the list of Ag, Ag-based alloys, and Al.

Figure 3:
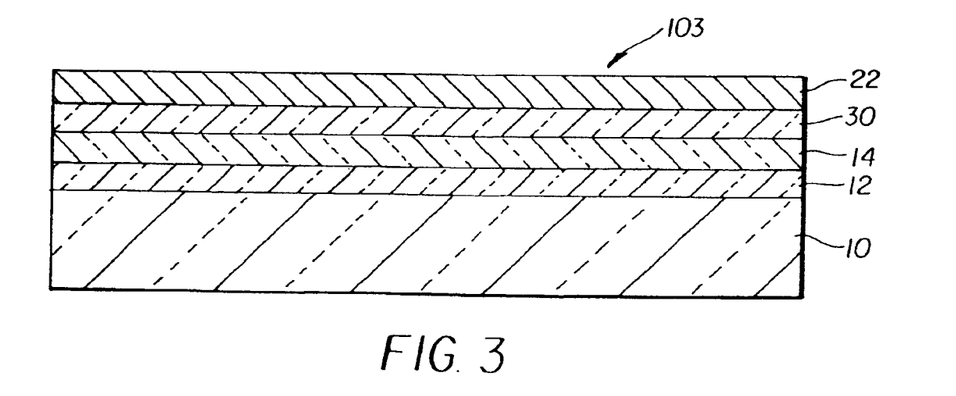
FIG. 3 depicts a schematic cross sectional view of an OLED device according to the present invention having a light scattering layer and a high reflectivity anode.

FIG. 3 is a schematic representation of an OLED device 103 according to the present invention. Similar to the prior art OLED device 102 shown in FIG. 2, OLED device 103 includes a transparent substrate 10, a light scattering layer 12 over transparent substrate 10, a transparent anode layer 14 over light scattering layer 12, an organic EL element 30 over transparent anode layer 14, and a reflecting cathode layer 22 over organic EL element 30. In contrast to the prior art, however, material for reflecting cathode layer 22 according to the present invention is restricted to high reflectivity Ag, Ag-based alloys, and Al. In the visible light region, only Ag, Ag-based alloys, and Al have reflectivity high enough that multiple absorption by the reflecting cathode layer will not result in substantial losses. Of these, Ag and Ag-based alloys with an Ag content greater than 90% are preferred for having higher reflectivity. Here the Ag content is based on atomic percentage. By using the highly reflecting materials, light absorption by cathode layer 22 is reduced. The trapped light in the OLED device 103 can travel along the OLED layers and pass through light scattering layer 12 multiple times and be effectively scattered out of the OLED device 103 before it suffers much attenuation loss. The light extraction efficiency of the OLED device 103 is thus improved.

Ag, Ag-based alloys, and Al anodes, however, may not provide adequate electron injection into some electron transport layers. In this case, organic EL element 30 preferably includes an electron injection layer as well. In some cases, direct contact of these metallic materials to organic EL element 30 can cause device instability. In these cases it can be desirable to have an interlayer stack between cathode layer 22 and organic EL element 30. This interlayer stack can include one or more layers that in combination can prevent or reduce degradation of the OLED devices due to the use of these metallic cathodes. Inorganic transparent conductive layers such as ITO, ZnS, ZTO, IZO, $Sb_2O_3$, etc. can be used in the interlayer stack. Organic materials such as metal containing phthalocyanines including copper phthalocyanine can also be used. The thickness of the inter-layer can be selected to reduce absorption by reflecting cathode layer 22.

FIG. 3 depicts a bottom emitting OLED device. The present invention can also apply to a top emitting device. In a top emitting device, cathode layer 22 is transparent and anode layer 14 has high reflectivity. Material for reflecting anode layer 14 is selected from a list including Ag, Ag-based alloys, and Al. In particular, Ag and Ag-based alloys with more than 90% Ag are preferred for having superior reflectivity. By using the highly reflecting materials, light absorption by anode layer 14 is reduced. The trapped light in the OLED device 103 can travel along the OLED layers and pass through light scattering layer 12 multiple times and be effectively scattered out of the OLED device 103 before it suffers much attenuation loss. The light extraction efficiency of the OLED device 103 is thus improved.

These high reflectivity materials, however, may not provide adequate hole injection into some hole transport layers in organic EL element 30. Organic EL element 30 preferably includes a hole injection layer as well. In some cases direct contact of these metallic materials to organic EL element 30 can cause device instability. In these cases it can be desirable to have an interlayer stack between anode layer 14 and organic EL element 30. This interlayer stack can include one or more layers which in combination having protective properties to prevent or reduce degradation of the OLED devices due to the use of these metallic anodes. Inorganic transparent conductive layers such as ITO, ZnS, ZTO, IZO, $Sb_2O_3$, etc. can be used as interlayer. Organic materials such as metal containing phthalocyanines including copper phthalocyanine can also be used. The thickness of the interlayer can be selected to reduce absorption by reflecting anode layer 14.

Turning again to FIG. 3, anode layer 14 and cathode layer 22 are both conductive layers that carry electricity from an outside power source (not shown) to the OLED device 103. Preferably, the sheet resistivity of anode layer 14 and cathode layer 22 is less than 100 ohms/square. Organic EL element 30 can include several layers including a hole injection layer, a hole transport layer, a light emitting layer, an electron transport layer, and an electron injection layer. In some cases, some of these layers can be combined. For example, a single layer can serve as both light emitting layer and electron transport layer. In other cases, some of these layers can be eliminated. For example, a properly chosen anode layer can eliminate the need for a separate hole injection layer and a properly chosen cathode layer can eliminate the need for a separate electron injection layer. The details of these layers will be described later. In the present application organic EL element 30 can refer to any of these possible combinations.

Figure 4:
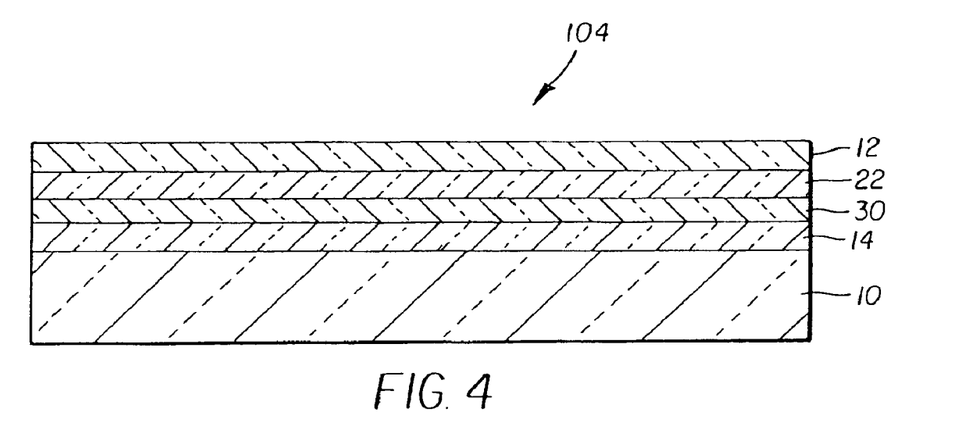
FIG. 4 depicts a schematic cross sectional view of an OLED device according to the present invention having transparent electrodes and a light scattering layer that allows light to emit from both top and bottom of the device.

FIG. 4 is a schematic representation of another OLED device 104 according to the present invention. OLED device 104 includes a substrate 10, a transparent anode layer 14 over substrate 10, an organic EL element 30 over anode layer 14, a transparent cathode layer 22 over organic EL element 30, and a light scattering layer 12 over organic EL element 30. Since OLED device 104 has both electrode layers transparent, there is little light absorption in the OLED structure. The trapped substrate-mode light 2 and organic-mode light 3 that is not scattered in their first pass through the light scattering layer 12 can now make many passes through the light scattering layer 12 and eventually being scattered out of the OLED device 104 without being attenuated by the transparent cathode layer 22. The extraction efficiency of OLED device 104 is thus improved over the prior art OLED device 102. OLED device 104 can have other layers in addition to those discussed above. For example, it can include a transparent protection layer over the light scattering layer 12. It can also have additional transparent layers between transparent cathode layer 22 and light scattering layer 12. As long as the optical index of the additional transparent layers is higher than or equal to that of the organic EL element 30, the performance of the OLED device 104 is not significantly affected.

Figure 5:
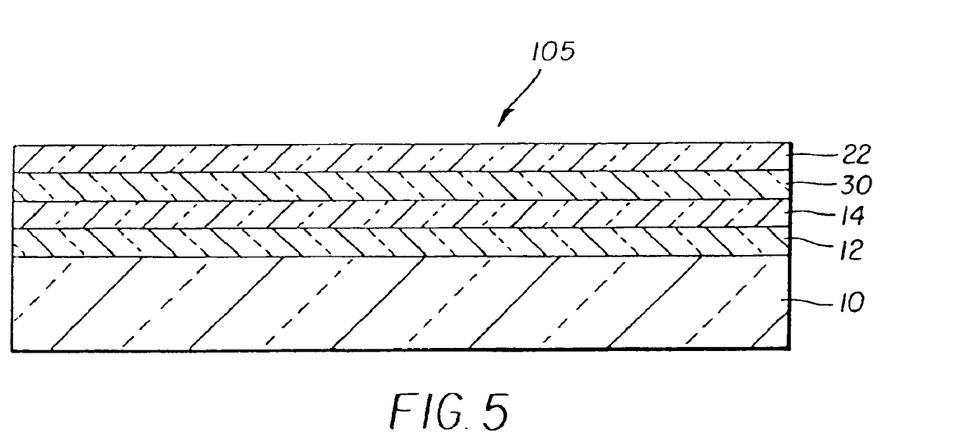
FIG. 5 depicts a schematic cross sectional view of another OLED device according to the present invention having transparent electrodes and a light scattering layer that allows light to emit from both top and bottom of the device.

FIG. 5 depicts another OLED device 105 in accordance with the present invention. OLED device 105 includes a substrate 10, a light scattering layer 12 disposed over a first surface of substrate 10, an anode layer 14 disposed over light scattering layer 12, an organic EL element 30 disposed over anode layer 14, and a transparent cathode 22 disposed over organic EL element 30. Similar to device 104 in having enhanced light extraction efficiency, OLED device 105 has the added advantage that light scattering layer 12 can be prepared prior to the deposition of the organic layers, which in some cases simplifies device manufacturing. Similar to OLED device 104, OLED device 105 can have additional transparent layers in the structure in additional to those shown in FIG. 5.

Since both electrodes are transparent, light generated from the OLED devices 104 and 105 emits from both sides of device. For many applications, it is desirable to direct most of the generated light to emit from one side of the OLED device. This can be done using an external light reflector.

Figure 6:
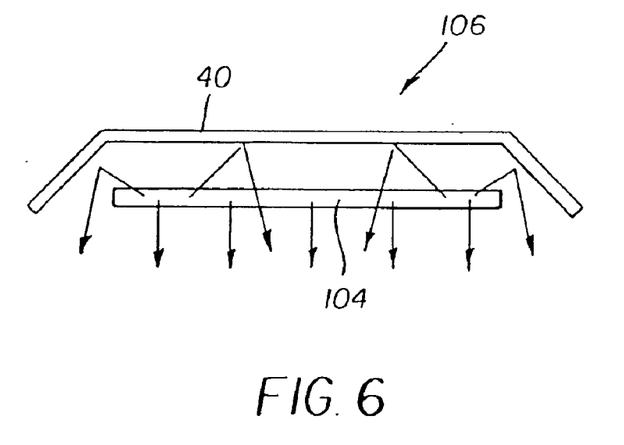
FIG. 6 depicts an OLED device according to the present invention that allows light to emit from both top and bottom of the device in a fixture that includes an external light reflector.

FIG. 6 illustrates one illumination device 106 according to the present invention including OLED device 104 or 105 in a fixture with an external light reflector 40. Light emitted from OLED device 104 or 105 in the downward direction stays in the downward direction. Light emitted from OLED device 104 or 105 in the upward direction is redirected by external light reflector 40 to the downward direction.

Figure 7:
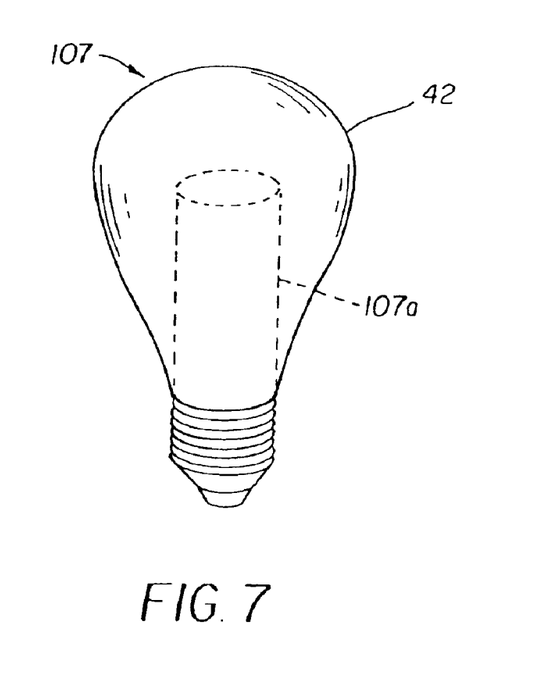
FIG. 7 illustrates an illumination device in accordance with the present invention comprising an OLED device on a flexible polymer sheet substrate inserted in a hermetically sealed enclosure in the shape of an incandescent light bulb.

FIG. 7 illustrates another illumination device 107 in accordance with the present invention. Here an OLED device 107a is made using flexible polymer sheet used as substrate 10. Anode layer 14, organic EL element 30, cathode layer 22, and light scattering layer 12 are disposed over substrate 10 in the same manner as in FIG. 4 or in FIG. 5. After the illumination device 107 is coated, the polymer sheet is cut into size, rolled, if desired, and inserted into a hermetically sealed enclosure. FIG. 7 shows an enclosure in the shape of an incandescent light bulb 42 so that illumination device 107 can be compatible with existing light fixtures that utilize incandescent light bulbs. Other forms of enclosures can also be used. Manufacturing using a flexible polymer sheet can potentially dramatically reduce production costs, but high permeability of water and oxygen through polymer sheets so far prevents successful utilization of polymer for OLED devices. According to the present invention, the illumination device with the flexible support is placed in a hermetically sealed enclosure where desiccating materials can also be included. Water and oxygen permeability requirements for the substrates can be reduced and the use of polymeric substrates can become practical.

Figure 8:
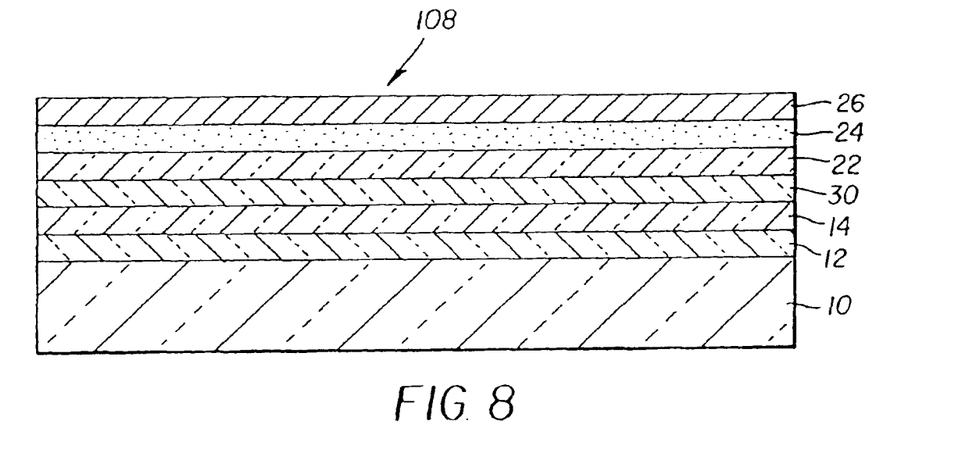
FIG. 8 depicts a schematic cross sectional view of a bottom emitting OLED device according to the present invention having transparent electrodes, a light scattering layer, a reflector layer, and a low index isolation layer wherein the light scattering layer is between the substrate and the bottom transparent electrode layer.

FIG. 8 depicts another OLED device 108 according to the present invention. OLED device 108 is a bottom emitting device including a substrate 10, a light scattering layer 12 over substrate 10, a transparent anode layer 14 over light scattering layer 12, an organic EL element 30 over transparent anode layer 14, a transparent cathode layer 22 over organic Element 30, a low index isolation layer 24 over transparent cathode layer 22, and a reflector layer 26 over low index isolation layer 24. Low-index isolation layer 24 is a transparent layer having optical index substantially lower than that of organic EL element 30. Light emitted from organic EL element 30 and arriving at transparent cathode layer 22/low-index isolation layer 24 interface at a larger-than-critical angle is totally internally reflected and never sees reflector layer 26. This component of light is trapped in the OLED device 108 and eventually scattered out the OLED device 108 through substrate 10 after several passes through light scattering layer 12. Small-angle light 1 from organic EL element 30 can transmit through low-index isolation layer 24 and be reflected by reflector layer 26 out of the OLED device 108 through substrate 10. Since it is reflected only once by reflecting layer 26, the absorption loss is small even if reflecting layer 26 is only partially reflecting. Compared with prior art device 102 in FIG. 2, OLED device 108 can have significantly reduced absorption loss due to multiple reflection and still have the benefit of a built-in reflector to direct all light to emit from one direction of an OLED device.

Figure 9:
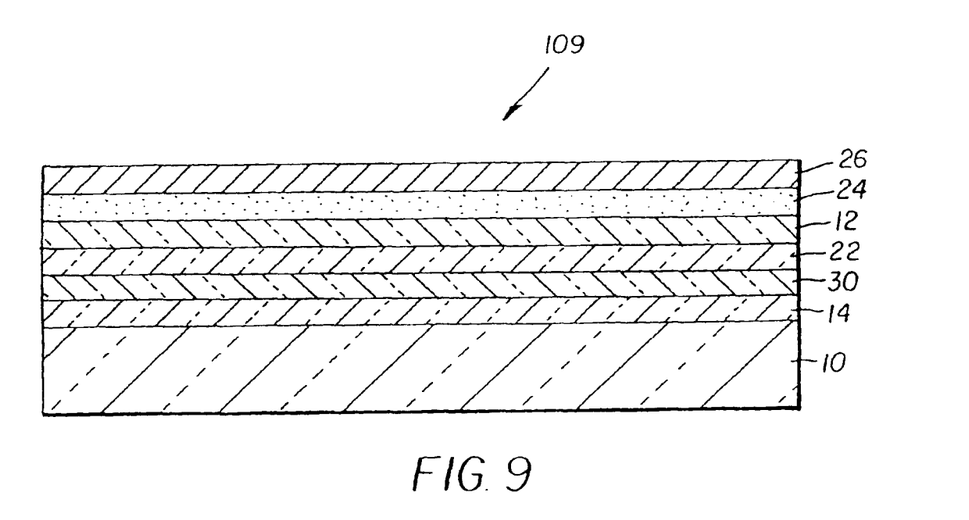
FIG. 9 depicts a schematic cross sectional view of another bottom emitting OLED device according to the present invention having transparent electrodes, a light scattering layer, reflector layer, and a low index isolation layer wherein the light scattering layer is between the low index isolation layer and the top transparent electrode layer.

FIG. 9 depicts another OLED device 109 according to the present invention. OLED device 109 is a bottom emitting device including a substrate 10, a transparent anode layer 14 over substrate 10, an organic EL element 30 over transparent anode layer 14, a transparent cathode layer 22 over organic EL element 30, a light scattering layer 12 over transparent cathode layer 22, a low-index isolation layer 24 over light scattering layer 12, and a reflector layer 26 over low index isolation layer 24. Similar to OLED device 108, the low-index isolation layer 24 prevents large angle light from reaching reflector layer 26 thereby reduces absorption loss by the latter. At the same time, small angle light 1 can reach reflector layer 26 and be reflected out the OLED device 109 through substrate 10.

Figure 10:
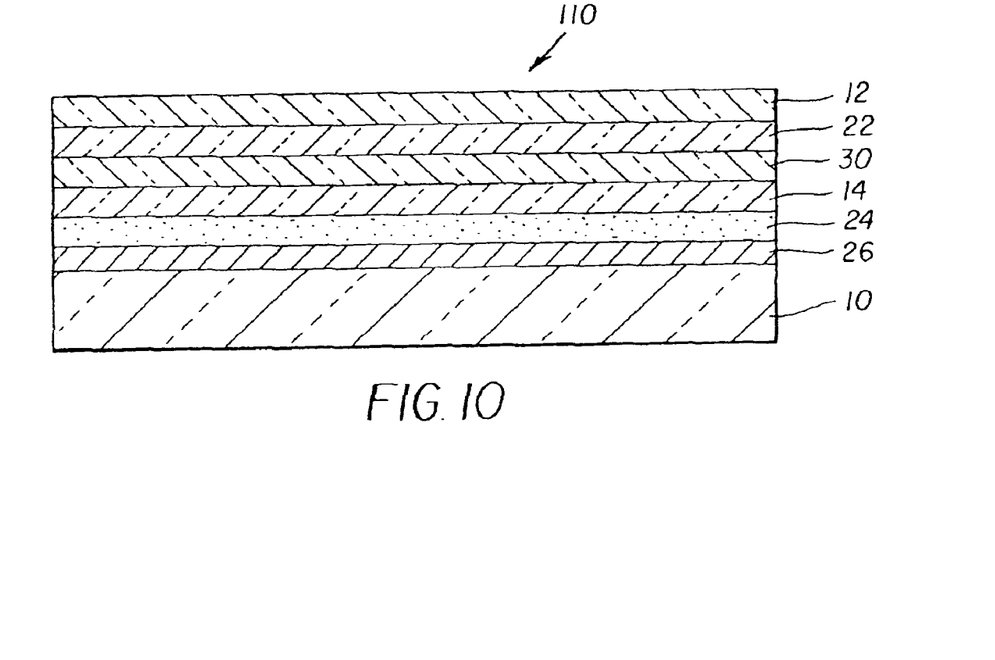
FIG. 10 depicts a schematic cross sectional view of a top emitting OLED device according to the present invention having transparent electrodes, a light scattering layer, a reflector layer, and a low index isolation layer wherein the light scattering layer is above the top transparent electrode layer.

FIG. 10 depicts another OLED device 110 according to the present invention. OLED device 110 is a top emitting device including a substrate 10, a reflector layer 26 over substrate 10, a low-index isolation layer 24 over reflector layer 26, a transparent anode layer 14 over low-index isolation layer 24, an organic EL element 30 over transparent anode layer 14, a transparent cathode layer 22 over organic EL element 30, and a light scattering layer 12 over transparent cathode layer 22. The low-index isolation layer 24 is a transparent layer having optical index substantially lower than that of organic EL element 30. Light emitted from organic EL element 30 and arriving at transparent anode 14/low-index isolation layer 24 interface at an larger than the critical angle is totally internally reflected and never sees the reflecting layer 26. This component of light is trapped in the OLED device 110 and eventually scattered out the OLED device 110 after several passes through light scattering layer 12. Small-angle light 1 from organic EL element 30 transmits through low-index isolation layer 24 and is reflected by reflector layer 26 out of the OLED device 110 through light scattering layer 12. Since it is reflected only once by reflector layer 26 the absorption loss is small even if reflector layer 26 is only partially absorbing. Compared with prior art device OLED 102 in FIG. 2, OLED device 110 can have significantly reduced absorption loss due to multiple reflection and still have the benefit of a built-in reflector to direct all light to emit from one direction of an OLED device.

Figure 11:
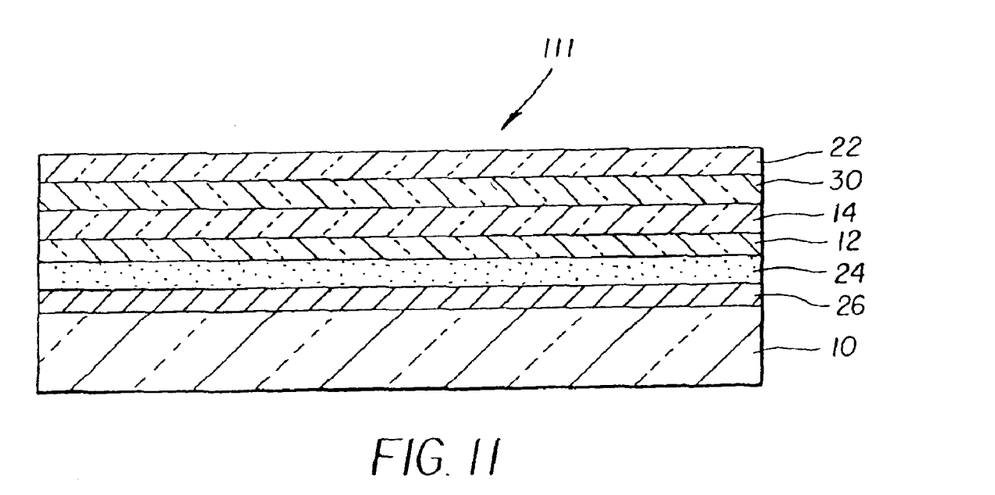
FIG. 11 depicts a schematic cross sectional view of another top emitting OLED device according to the present invention having transparent electrodes, a light scattering layer, a reflector layer, and a low index isolation layer wherein the light scattering layer is between the bottom transparent electrode layer and the substrate.

FIG. 11 depicts another top emitting OLED device 111 according to the present invention. OLED device 111 includes a substrate 10, a reflector layer 26, a low-index isolation layer 24, a light scattering layer 12, a transparent anode layer 14, an organic EL element 30, and a transparent cathode layer 22.

The disclosure has been focusing on structures having first electrode layer closer to the substrate being anode layer 14, it is well understood that the structure could be reversed such that the first electrode layer next to substrate 10 is cathode layer 22 the second electrode layer disposed over organic EL element 30 is anode layer 14.

It is also possible to include other functional layers in the structure, such as an electron injection layer, a hole injection layer, an electron transport layer, a hole transport layer, additional protective layers over the OLED device, etc. A more detailed description of these layers will be given below.

Substrate

The OLED device of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course it is necessary to provide in these device configurations a light-transparent top electrode.

For many applications the substrate is provided with other functional elements. For example, in an active-matrix display device as described in commonly-assigned U.S. Pat. No. 5,684,365, the substrate surface is provided with a Thin-Film Transistor circuitry (TFT) that may include patterned semiconductor layers, conductor layers, insulating layers, planalization layers, etc. In an passive matrix display device, the substrate is provided with patterned anodes and may include base and pillar structure used in the manufacturing process as described in commonly-assigned U.S. Pat. No. 5,276,380.

Anode Layer

The anode layer is a layer or a stack of layers having enough conductivity to carry the operating current from an outside power supply to the OLED device. The sheet resistivity of the anode layer should be 100 ohms per square or less. The anode layer according to the present invention should be either highly reflective or substantially transparent to the emission of interest. Material for highly reflective anodes can be selected from a list including Ag, Ag-based alloys, or Al. These materials have higher reflectivity than most other materials that allow them to be used in the present invention with scattering layers with reduced absorption loss. Of these materials, pure Ag and Ag-based alloys with over 90% Ag are preferred due to their exceptional high reflectivity. For transparent anodes, the less absorbing the material used, the more efficient the OLED device can be. As a general guideline, the imaginary part of optical index, k, is preferably less than 0.02. Common transparent anode materials that can be used in this invention are indium-tin oxide (ITO), indium-zinc oxide (IZO), zinc-tin oxide (ZTO), and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. A sandwich of thin metal films such as Au, Ag, or Cu and high index transparent materials such as ZnS, $TiO_2$, ITO, etc. can also be used. When the proper material and thickness are used, the total absorption of light can be less than 5%. Typical anode materials have a work function of 4.1 eV or greater. With a separate effective hole-injecting layer, however, the work function of the anode becomes less critical and can take almost any value. Desired anode materials are commonly deposited by any suitable means such as evaporation, sputtering, chemical vapor deposition, or electrochemical means. Anodes can be patterned using well-known photolithographic processes or by using shadow masks during preparation.

Light Scattering Layer

The light scattering layer used in the present invention can consist of scattering centers embedded in a matrix, or it can include textures or microstructures on a surface. In the case of having scattering centers embedded in a matrix, the optical index of the matrix needs to be comparable to or larger than that of the organic EL element 30, preferably not smaller than 0.9 of the latter, for the light to enter the scattering layer effectively. Since common organic materials used as organic EL element 30 in OLED devices have relative high optical indexes, $\geq 1.7$, the index of the matrix needs to be about 1.55 or greater. If the index of the organic EL element 30 is smaller, however, the index of the matrix can be correspondingly smaller. The matrix of the light scattering layer can be a polymer coated as a thin-layer from a solution, from a melt, or other suitable forms. It can also be a monomer and polymerized after being coated as a thin-film by UV-light, heat, or other suitable means. Common coating techniques such as spin-coating, blade coating, screening printing, etc. can be appropriately selected. Alternatively, the scattering layer can be a separate element laminated to the surface of the top electrode layer or to the substrate, depending on the desired location of the scattering layer in the OLED device structure. The index of the scattering centers need to be significantly different from that of the matrix, and preferably differ by more than 5% of the index value of light emitting layer. The scattering centers can include particles, exemplary particle materials are $TiO_2$, $Sb_2O_3$, CaO, $In_2O_3$, etc, or it can include voids or air bubbles. The size of the particles must be comparable to the wavelength of light to be scattered, and can range from several tens of nanometers to several micrometers. The thickness of the scattering layer can range from less than a micrometer to several micrometers. The thickness and the loading of particles in the matrix need to be optimized to achieve optimum light extraction from any OLED devices. In the case of scattering layers having textures or microstructures on a surface, the texture or microstructure can be micro-lens, or they can be periodical or random structure of depth and size comparable to the wavelength to be scattered. These surface features can be created while the scattering layer is coated, or they can be embossed after the scattering layer is coated. The scattering layer with surface scattering features can also be made separately and laminated to the OLED device.

Low-index Isolation Layer

The low-index isolation layer is used to reduce the absorption of light by the reflecting layer using the effect of total internal reflection and light trapping. It is disposed between the reflecting layer and the rest of the layers in the OLED device. The organic EL element can include several layers, but usually all these layer have relatively high optical index of reflection. The most common materials have indexes of about 1.7 or higher, the isolation layer therefore needs to have an index of about 1.55 or lower. The low index isolation layer can be a polymer layer and, preferably, a photo-polymer layer. The low index isolation layer can also be an inorganic layer including, but not limited to, $MgF_2$, NaF, KF, $Bi_2S_3$, $Na_5Al_3F_{14}$ Hole-Injecting Layer (HIL)

It is often useful to provide a hole-injecting layer between the anode and the hole-transporting layer. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in commonly-assigned U.S. Pat. No. 4,720,432, and plasma-deposited fluorocarbon polymers as described in commonly-assigned U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al in commonly-assigned U.S. Pat. Nos. 3,567,450 and 3,658,520.

A more preferred class of aromatic tertiary amines are those which include at least two aromatic tertiary amine moieties as described in commonly-assigned U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl] amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. commonly-assigned 4,769,292 and U.S. Pat. No. 5,935,721, the light-emitting layer (LEL) of the organic EL element 30 includes a luminescent or fluorescent material where electroluminescence is produced as a result of electron-hole pair recombination in this region. The light-emitting layer can include a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in commonly-assigned U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato) aluminum(III)]
CO-2: Magnesium bisoxine [alias, bis(8-quinolinolato) magnesium(II)]
CO-3: Bis[benzo {f}-8-quinolinolato]zinc (II)
CO-4: Bis(2-methyl-8-quinolinolato)aluminum(III)-μ-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato)aluminum(III)]

CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato) zirconium(IV)]

Other classes of useful host materials include, but are not limited to: derivatives of anthracene, such as 9,10-di-(2-naphthyl)anthracene and derivatives thereof, distyrylarylene derivatives as described in U.S. Pat. No. 5,121,029, and benzazole derivatives, for example, 2, 2', 2"-(1,3,5-phenylene)tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Electron-transporting Layer (ETL)

Preferred thin film-forming materials for use in forming the electron-transporting layer of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in commonly-assigned U.S. Pat. No. 4,356,429 and various heterocyclic optical brighteners as described in commonly-assigned U.S. Pat. No. 4,539,507. Benzazoles and triazines are also useful electron-transporting materials.

In some instances, the light emission layer and the electron transport layers can optionally be collapsed into a single layer that serves the function of supporting both light emission and electron transport. These layers can be collapsed in both small molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

Electron Injection Layer

Electron injecting layers including those taught in U.S. Pat. Nos. 5,608,287; 5,776,622; 5,776,623; 6,137,223; 6,140,763 disclosures of which are here incorporated by reference, can be employed.

Cathode

The cathode layer is a layer or a stack of layers having enough conductivity to carry the operating current from an outside power supply to the OLED device. The sheet resistivity of the cathode layer should be 100 ohms per square or less. Cathode layer according to the present invention should be either highly reflective or substantially transparent to the emission of interest. Material for highly reflective cathodes can be selected from a list including Ag, Ag-based alloys, or Al. These materials have higher reflectivity than most other materials that allow them to be used in the present invention with scattering layers with reduced absorption loss. Of these materials, pure Ag and Ag-based alloys with over 90% Ag are preferred due to their exceptional high reflectivity. For transparent cathodes, the less absorbing the material used, the more efficient the OLED device can be. As a general guideline, the imaginary part of optical index, k, is preferably less than 0.02. Common transparent cathode materials that can be used in this invention are indium-tin oxide (ITO), indium-zinc oxide (IZO), zinctin oxide (ZTO), and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the cathode. A sandwich of thin metal films such as Au, Ag, or Cu and high index transparent materials such as ZnS, $TiO_2$, ITO, etc. can also be used. When the proper material and thickness are used, the total absorption of light can be less than 5%. Typical cathode materials have a work function of 4.1 eV or less. With a separate effective hole-injecting layer, however, the work function of the anode becomes less critical and can take almost any value. Optically transparent cathodes have been described in more detail in U.S. Pat. Nos. 4,885,211; 5,247,190, JP 3,234,963; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459, EP 1 076 368, and U.S. Pat. No. 6,278,236. Cathode materials are typically deposited by evaporation, sputtering, or chemical vapor deposition. When needed, patterning can be achieved through many well known methods including, but not limited to, through-mask deposition, integral shadow masking as described in commonly-assigned U.S. Pat. No. 5,276,380 and EP 0 732 868, laser ablation, and selective chemical vapor deposition.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in commonly-assigned U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (commonly-assigned U.S. Pat. No. 5,294,870), spatially-defined thermal dye transfer from a donor sheet (commonly-assigned U.S. Pat. Nos. 5,851,709 and 6,066,357) and inkjet method (commonly-assigned U.S. Pat. No. 6,066,357).

Encapsulation

Most OLED apparatus are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in commonly-assigned U.S. Pat. No. 6,226,890. In addition, barrier layers such as SiOx, Teflon, and alternating inorganic/polymeric layers are known in the art for encapsulation.

Mechanical Protection

OLED devices are thin-film devices vulnerable to mechanical damage and need to be protected during handling and usage. Frequently methods for encapsulation also provide mechanical protection. In some cases a solid plate of glass, plastic, or other materials are attached to the active surface of an OLED device using adhesives. In other cases a protective layer is deposited over the top surface of an OLED device. The solid plate or deposited protective layer is referred as optional protective layer 28 in this application. For a top emitting device in particular, the solid plate needs to be transparent to the emitted light and becomes part of the optical structure of the OLED device.

Optical Optimization

The OLED apparatus of this invention employs a plurality of OLED devices that use various well-known optical effects in order to enhance its properties if desired. This includes optimizing layer thickness to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The invention has been described in detail with particular reference to certain preferred embodiments thereof, but it will be understood that variations and modifications can be effected within the spirit and scope of the invention.

PARTS LIST

| | |
|---|---|
| 1 | Small angle light |
| 2 | Substrate-mode light |
| 3 | Organic-mode light |
| 10 | substrate |
| 12 | light scattering layer |
| 14 | anode layer |
| 22 | cathode layer |
| 24 | low index isolation layer |
| 26 | reflecting layer |
| 30 | organic EL element |
| 40 | external light reflector |
| 42 | enclosure in the shape of an incandescent light bulb |
| 101 | OLED device |
| 102 | OLED device |
| 103 | OLED device |
| 104 | OLED device |
| 105 | OLED device |
| 106 | illumination device |
| 107 | illumination device |
| 107a | OLED device |
| 108 | OLED device |
| 109 | OLED device |
| 110 | OLED device |
| 111 | OLED device |

What is claimed is:

1. An enhanced light extraction OLED device comprising:
   (a) a transparent substrate;
   (b) a light scattering layer disposed over a first surface of the transparent substrate;
   (c) a transparent first electrode layer disposed over the light scattering layer;
   (d) an organic EL element disposed over the transparent first electrode layer and including one or more organic layers but at least one light emitting layer in which light is produced;
   (e) a transparent second electrode layer disposed over the organic EL element;
   (f) a reflector layer disposed over the transparent second electrode layer; and
   (g) a low index isolation layer having an optical index lower than the light emitting layer disposed between the transparent second electrode layer and the reflector layer.

2. The OLED device of claim 1 wherein the isolation layer is a photo-polymer.

3. The OLED device of claim 1 wherein the isolation layer is an inorganic dielectric layer including $MgF_2$, NaF, KF, $Bi_2S_3$, or $Na_5Al_3F_{14}$.

4. The OLED device of claim 1 wherein the reflector layer is selected from the group consisting of Ag, Ag-based alloys, and Al.

5. The OLED device of claim 1 wherein the reflector layer is selected from the group consisting of Ag and Ag-based alloys with more than 90% Ag.

6. The OLED device of claim 1 further including a light reflective structure spaced from the OLED device which reflects light in the direction of the OLED device.

7. The OLED device of claim 1 wherein the transparent substrate is a flexible sheet.

8. The OLED device of claim 7 wherein the OLED device is enclosed in a hermetically sealed enclosure having a transparent window through which light produced by the OLED device passes.

9. The OLED device of claim 8 wherein the sealed enclosure is in the shape of an incandescent light bulb.

10. An enhanced light extraction OLED) device comprising:
    (a) a transparent substrate;
    (b) a transparent first electrode layer disposed over a first surface of the transparent substrate;
    (c) an organic EL element disposed over the first electrode layer and including one or more organic layers but at least one emissive layer in which light is produced;
    (d) a transparent second electrode layer disposed over the organic EL element, and
    (e) a light scattering layer disposed over the transparent second electrode layer.

11. The OLED device of claim 10 wherein a reflector layer is disposed over the light scattering layer.

12. The OLED device of claim 11 wherein a low index isolation layer having an optical index lower than the light emitting layer is disposed between the light scattering layer and the reflector layer.

13. The OLED device of claim 10 wherein the light scattering layer includes light scattering particles dispersed in a matrix.

14. The OLED device of claim 10 wherein the matrix has optical index no less than 0.9 times the optical index of the light emitting layer.

15. The OLED device of claim 10 wherein the light scattering particles have optical index different from the matrix.

16. The OLED device of claim 12 wherein the isolation layer is a photo-polymer.

17. The OLED device of claim 12 wherein the isolation layer is an inorganic dielectric layer including $MgF_2$, NaF, KF, $Bi_2S_3$, or $Na_5Al_3F_{14}$.

18. The OLED device of claim 11 wherein the reflector layer is selected from the group consisting of Ag, Ag-based alloys, and Al.

19. The OLED device of claim 11 wherein the reflector layer is selected from the group consisting of Ag and Ag-based alloys with more than 90% Ag.

20. An enhanced light extraction OLED device comprising:
    (a) a substrate;
    (b) a reflector layer disposed over a first surface of the substrate;
    (c) a light scattering layer;

(d) a transparent first electrode layer disposed over the light scattering layer;

(e) an organic EL element disposed over the transparent first electrode layer and including one or more organic layers but at least one emissive layer in which light is produced; and (f) a transparent second electrode layer disposed over the organic EL element.

21. The OLED device of claim 20 wherein a low index isolation layer is disposed between the reflector layer and the light scattering layer.

22. The OLED device of claim 20 wherein the light scattering layer includes light scattering particles dispersed in a matrix.

23. The OLED device of claim 22 wherein the matrix has optical index no less than 0.9 times the optical index of the light emitting layer.

24. The OLED device of claim 22 wherein the light scattering particles have optical index different from the matrix.

25. The OLED device of claim 21 wherein the isolation layer is a photo-polymer.

26. The OLED device of claim 21 wherein the isolation layer is an inorganic dielectric layer including $MgF_2$, NaF, KF, $Bi_2S_3$, or $Na_5Al_3F_{14}$.

27. The OLED device of claim 20 wherein the reflector layer is selected from the group consisting of Ag, Ag-based alloys, and Al.

28. The OLED device of claim 20 wherein the reflector layer is selected from the group consisting of Ag and Ag-based alloys with more than 90% Ag.

29. An enhanced light extraction OLED device comprising:

(a) a substrate;

(b) a reflector layer disposed over a first surface of the substrate;

(c) a transparent first electrode layer disposed over the reflector layer;

(d) an organic EL element disposed over the transparent first electrode layer and including one or more organic layers but at least one emissive layer in which light is produced;

(e) a transparent second electrode layer disposed over the organic EL element; and (f) a light scattering layer disposed over the transparent second electrode layer; and (g) a low index isolation layer is disposed between the reflector layer and the organic element.

30. The OLED device of claim 29 wherein the isolation layer is a photo-polymer.

31. The OLED device of claim 29 wherein the isolation layer is an inorganic dielectric layer including $MgF_2$, NaF, KF, $Bi_2S_3$, or $Na_5Al_3F_{14}$.

32. The OLED device of claim 29 wherein the reflector layer is selected from the group consisting of Ag, Ag-based alloys, and Al.

33. The OLED device of claim 29 wherein the reflector layer is selected from the group consisting of Ag and Ag-based alloys with more than 90% Ag.

34. An enhanced light extraction OLED device comprising:

(a) a transparent substrate;

(b) a light scattering layer disposed over a first surface of transparent substrate;

(c) a transparent first electrode layer disposed over the light scattering layer;

(d) an organic EL element disposed over the transparent first electrode layer and including one or more organic layers but at least one light emitting layer in which light is produced;

e) a reflecting second electrode layer disposed over the organic EL element, wherein material for the reflecting second electrode layer is selected from a list including Ag, Ag-based alloys, and Al;

f) an interlayer disposed between the organic EL element and the reflecting second electrode layer to improve device stability.

35. The OLED device of claim 34 wherein the reflecting second electrode is selected from the group consisting of Ag and Ag-based alloys with more than 90% Ag.

36. The OLED device of claim 34 wherein the interlayer is an inorganic transparent conductive layer.

37. The OLED device of claim 34 wherein the interlayer is selected from the group consisting of indium-tin oxide, indium-zinc oxide, zinc-tin oxide, and antimony oxide.

38. The OLED device of claim 34 wherein the interlayer is a metal containing phthalocyanine including copper phthalocyanine.

39. An enhanced light extraction OLED device comprising:

(a) a substrate;

(b) a reflecting first electrode layer disposed over the substrate, wherein the material for the reflecting first electrode layer is selected from a list including Ag, Ag-based alloys, and Al;

(c) an organic EL element disposed over the reflecting first electrode layer and including one or more organic layers but at least one light emitting layer in which light is produced;

(d) a transparent second electrode layer disposed over the organic EL element;

(e) a light scattering layer disposed over the transparent second electrode layer; and (f) an interlayer disposed between the organic EL element and the reflecting first electrode layer to improve device stability wherein the interlayer is selected from the group consisting of indium-tin oxide, indium-zinc oxide, zinc-tin oxide, and antimony oxide.

40. The OLED device of claim 39 wherein the reflecting second electrode is selected from the group consisting of Ag and Ag-based alloys with more than 90% Ag.

41. The OLED device of claim 39 wherein the interlayer is an inorganic transparent conductive layer.

42. An enhanced light extraction OLED device comprising:

(a) a transparent substrate;

(b) a light scattering layer disposed over a first surface of the transparent substrate wherein the light scattering layer comprises light scattering particles dispersed in a matrix and the matrix has an optical index no less than 0.9 times the optical index of the light emitting layer;

(c) a transparent first electrode layer disposed over the light scattering layer, (d) an organic EL element disposed over the transparent first electrode layer and including one or more organic layers but at least one light emitting layer in which light is produced; and (e) a transparent second electrode layer disposed over the organic EL element.

43. The OLED device of claim 42 wherein the light scattering particles have optical index different from the matrix.

44. An enhanced light extraction OLED device comprising:

(a) a substrate;

(b) a reflecting first electrode layer disposed over the substrate, wherein the material for the reflecting first electrode layer is selected from a list including Ag, Ag-based alloys, and Al;

(c) an organic EL element disposed over the reflecting first electrode layer and including one or more organic layers but at least one light emitting layer in which light is produced;

(d) a transparent second electrode layer disposed over the organic EL element;

(e) a light scattering layer disposed over the transparent second electrode layer; and (f) an interlayer disposed between the organic EL element and the reflecting first electrode layer to improve device stability wherein the interlayer is a metal containing phthalocyanine including copper phthalocyanine.

45. An enhanced light extraction OLED device comprising:

(a) a substrate;

(b) a reflector layer disposed over a first surface of the substrate;

(c) a transparent first electrode layer disposed over the reflector layer;

(d) an organic EL element disposed over the transparent first electrode layer and including one or more organic layers but at least one emissive layer in which light is produced;

(e) a transparent second electrode layer disposed over the organic EL element; and (f) a light scattering layer disposed over the transparent second electrode layer wherein the light scattering layer includes a matrix having dispersed light scattering particles, the matrix having an optical index no less than 0.9 times the optical index of the light emitting layer.

* * * * *